(12) United States Patent
Zhou et al.

(10) Patent No.: US 9,837,887 B1
(45) Date of Patent: Dec. 5, 2017

(54) IGBT GATE DRIVE WITH ACTIVE TURNOFF TO REDUCE SWITCHING LOSS

(71) Applicant: Ford Global Technologies, LLC, Dearborn, MI (US)

(72) Inventors: Yan Zhou, Canton, MI (US); Lihua Chen, Northville, MI (US); Shuitao Yang, Dearborn Heights, MI (US); Fan Xu, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 15/224,713

(22) Filed: Aug. 1, 2016

(51) Int. Cl.
| | |
|---|---|
| H02P 1/04 | (2006.01) |
| H02M 1/088 | (2006.01) |
| H02P 27/08 | (2006.01) |
| H03K 17/567 | (2006.01) |
| B60L 11/18 | (2006.01) |
| B60K 6/42 | (2007.10) |
| H02M 1/00 | (2006.01) |

(52) U.S. Cl.
CPC ............ H02M 1/088 (2013.01); B60K 6/42 (2013.01); B60L 11/1803 (2013.01); H02P 27/08 (2013.01); H03K 17/567 (2013.01); B60L 2210/14 (2013.01); H02M 2001/0054 (2013.01)

(58) Field of Classification Search
CPC .. H02P 27/04; H02P 27/06; H02P 6/00; H02P 7/00; H02P 23/00; H03K 17/168; H03K 17/567; H02M 7/217; H02M 3/07; B60L 11/1803

USPC ......... 318/400.01, 400.14, 400.15, 599, 700, 318/800, 801, 811, 430, 432, 437, 400.26, 318/400.27; 363/40, 44, 95, 120; 323/259, 344
See application file for complete search history.

(56) References Cited

U.S. PATENT DOCUMENTS

| | | | |
|---|---|---|---|
| 6,462,962 B1 * | 10/2002 | Cuk | H02M 1/34 363/131 |
| 7,274,243 B2 | 9/2007 | Pace et al. | |
| 7,622,887 B2 * | 11/2009 | Yoshimura | H01F 19/08 318/810 |
| 8,466,734 B2 | 6/2013 | Mori | |
| 2007/0216377 A1 * | 9/2007 | Yoshimura | H04L 25/0266 323/250 |
| 2014/0192449 A1 | 7/2014 | Shimizu | |
| 2016/0226386 A1 * | 8/2016 | Fukuta | B60L 11/18 |

* cited by examiner

*Primary Examiner* — Antony M Paul
(74) *Attorney, Agent, or Firm* — David B. Kelley; Brooks Kushman P.C.

(57) ABSTRACT

A vehicle powertrain includes an IGBT, having a Kelvin emitter and a mirror current sense, configured to energize an inductance, a first switch configured to draw a current from a gate of the IGBT at a rate based on a resistance engaged by the first switch while a current of the inductance exceeds a threshold, and a second switch configured to increase the rate in response to the current being less than the threshold. In one embodiment, the current is based on a filtered voltage across a resistor connected between the mirror current sense and chassis ground while the Kelvin emitter is connected to chassis ground. In another embodiment, the current is based on a filtered voltage across a resistor connected between the mirror current sense and the Kelvin emitter.

20 Claims, 7 Drawing Sheets

IGBT GATE DRIVE WITH ACTIVE TURNOFF TO REDUCE SWITCHING LOSS

TECHNICAL FIELD

This application is generally related to a system and control of a voltage on a gate of an IGBT in a hybrid-electric powertrain during device turnoff to reduce switching loss.

BACKGROUND

Electrified vehicles including hybrid-electric vehicles (HEVs) and battery electric vehicles (BEVs) rely on a traction battery to provide power to a traction motor for propulsion and a power inverter therebetween to convert direct current (DC) power to alternating current (AC) power. The typical AC traction motor is a 3-phase motor that may be powered by 3 sinusoidal signals each driven with 120 degrees phase separation. The traction battery is configured to operate in a particular voltage range. The terminal voltage of a typical traction battery is over 100 Volts DC, and the traction battery is alternatively referred to as a high-voltage battery. However, improved performance of electric machines may be achieved by operating in a different voltage range, typically at higher voltages than the traction battery.

Many electrified vehicles include a DC-DC converter, also referred to as a variable voltage converter (VVC), to convert the voltage of the traction battery to an operational voltage level of the electric machine. The electric machine, that may include a traction motor, may require a high voltage and high current. Due to the voltage, current and switching requirements, an Insulated Gate Bipolar junction Transistor (IGBT) is typically used to generate the signals in the power inverter and the VVC.

SUMMARY

A vehicle powertrain includes an IGBT, having a Kelvin emitter and a mirror current sense, configured to energize an inductance, a first switch configured to draw a current from a gate of the IGBT at a rate based on a resistance engaged by the first switch while a current of the inductance exceeds a threshold, and a second switch configured to increase the rate in response to the current being less than the threshold.

A method of shutting off an IGBT of an automotive power system by a gate driver includes, extracting a current from a gate of an IGBT at a rate based on a resistance associated with closing a second switch in response to a phase current of an electric machine driven by the IGBT being less than a threshold, and in response to the phase current exceeding the threshold, opening the second switch to decrease the rate.

A vehicle powertrain includes an IGBT, having a Kelvin emitter, configured to energize an inductance, a first switch configured to draw a current from a gate of the IGBT at a rate based on a resistance engaged by the first switch, and a second switch configured to increase the rate in response to a rate of change of current of the inductance exceeding a threshold rate of change.

DETAILED DESCRIPTION

Figure 1:
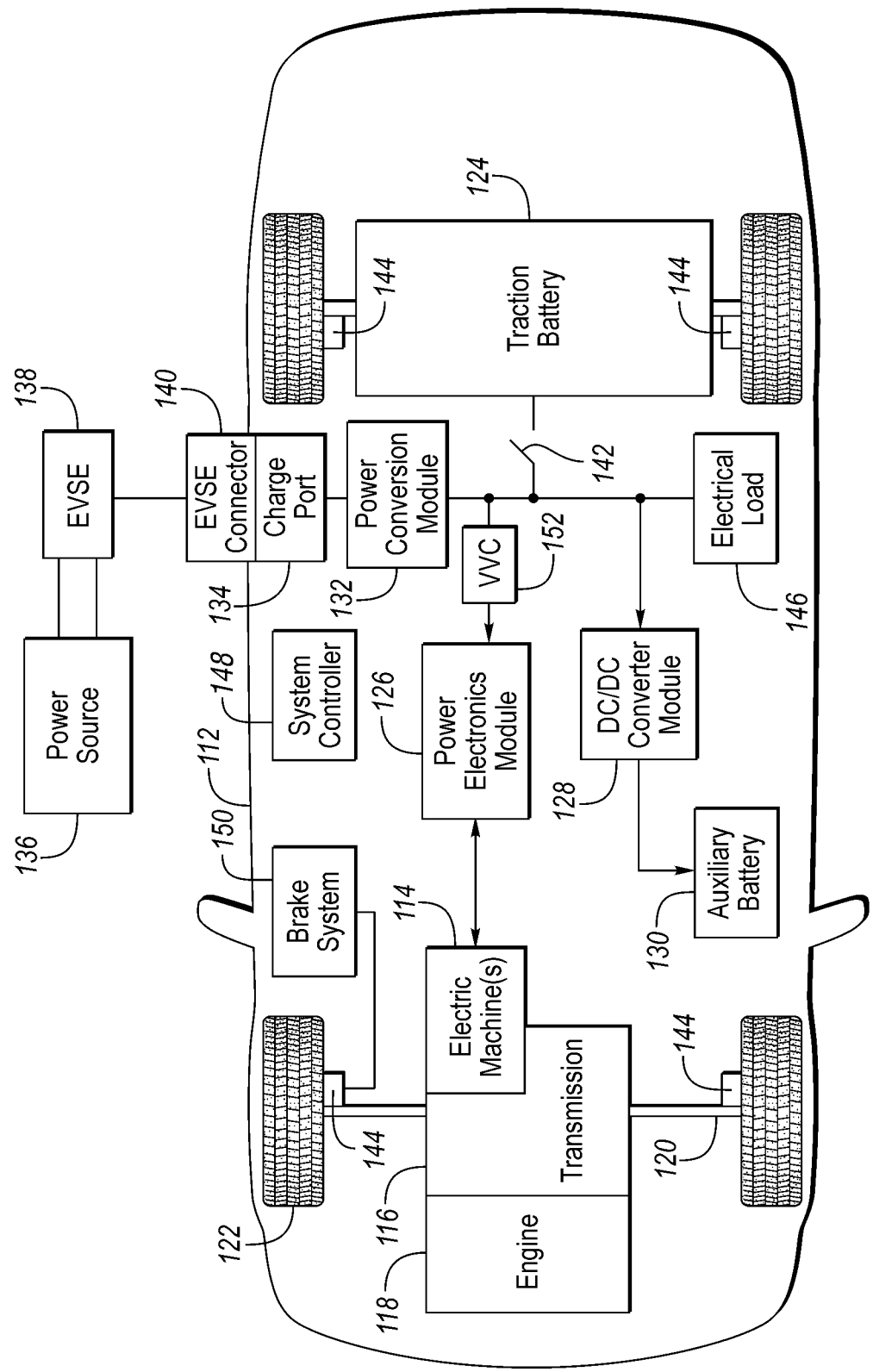
FIG. 1 is a diagram of a hybrid vehicle illustrating typical drivetrain and energy storage components with a variable voltage converter and power inverter therebetween.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Insulated Gate Bipolar junction Transistors (IGBTs) and freewheeling diodes are widely used in a variety of industrial applications, such as electric motor drives and power inverters. Operation of an IGBT is controlled by a gate voltage supplied by a gate driver. Conventional gate drivers are typically based on a voltage, greater than a threshold voltage, applied to an IGBT gate with a current limiting resistor, which may consist of a switchable voltage source and gate resistor. A low gate resistance would lead to a fast switching speed and low switching loss, but also cause higher stresses on the semiconductor devices, e.g. over-voltage stress. Therefore, the gate resistance is selected to seek a compromise between switching loss, switching delay, and stresses. When turning off an IGBT, a large gate resistor reduces the current flowing from the gate and thereby increases a shutoff time of the IGBT.

Some disadvantages associated with conventional gate drivers for IGBT turn-on and turnoff include limited control of switching delay time, current slope and voltage slope such that optimization switching losses are limited. Another disadvantage is that a gate resistance is typically selected based on worst case operating condition, thus introducing excessive switching losses under normal operating conditions. For example, at a high dc bus voltage, a gate resistance is selected based on a change in current with respect to time (di/dt) in order to avoid excessive IGBT voltage overshoot. However, at low di/dt the use of the gate resistance selected to protect for the worst case high di/dt results in excessive switching losses, therefore during low di/dt operation, the switching speed may be increased by decreasing the gate resistance to decrease the turn-off time.

Here, the turnoff of a solid state switch, such as an IGBT, a Metal Oxide Semiconductor Field Effect Transistor (MOSFET), or a bi-polar junction transistor (BJT), is adjusted based on a current flowing from the solid state switch to an inductive load, such as a phase of an electric machine or a DC-DC converter inductor.

In a conventional gate drive system, the gate drive for an IGBT turn-off is typically a step function from a turn-on voltage such as 15V to a turn-off voltage such as 0V. A low gate resistance Rg would lead to fast switching speeds and low switching loss, but may also cause higher stresses on the semiconductor devices, e.g. over-voltage stress. Therefore, the gate resistance is selected to seek a compromise between switching loss, switching delay, and stresses. Often, separate gate resistances are used to limit current flow during turn-on and turn-off of the IGBT. The separate gate resistance may include a Ron gate resistance used to turn on the IGBT, and a Roff gate resistance used to turn off the IGBT. Typically, conventional gate drive systems cannot control switching delay time, current slope and voltage slope individually to optimize the switching trajectory.

During an IGBT turn-off when a current is being drawn from the gate of the IGBT, the change in current with respect to time (di/dt) may result in a surge voltage across the IGBT due to inductance leakage in the power circuit loop. When designing a turn-off gate resistance Roff, a value of Roff is selected such that the surge voltage plus the dc link voltage does not exceed the IGBT voltage rating under any current levels. Typically at higher current levels, the surge voltage is higher. Thus, the value of Roff is typically selected based on the surge voltage at the highest possible turn-off current level that is a maximum load current. However, in most applications, the inverter/converter mainly operates at current levels far below than the maximum load current. Therefore, the inverter/converter efficiencies at the most operated points are sacrificed. Here, a fast turn-off is disclosed at an IGBT current level less than the maximum load current level of the IGBT.

FIG. 1 depicts an electrified vehicle 112 that may be referred to as a plug-in hybrid-electric vehicle (PHEV). A plug-in hybrid-electric vehicle 112 may comprise one or more electric machines 114 mechanically coupled to a hybrid transmission 116. The electric machines 114 may be capable of operating as a motor or a generator. In addition, the hybrid transmission 116 is mechanically coupled to an engine 118. The hybrid transmission 116 is also mechanically coupled to a drive shaft 120 that is mechanically coupled to the wheels 122. The electric machines 114 can provide propulsion and deceleration capability when the engine 118 is turned on or off. The electric machines 114 may also act as generators and can provide fuel economy benefits by recovering energy that would normally be lost as heat in a friction braking system. The electric machines 114 may also reduce vehicle emissions by allowing the engine 118 to operate at more efficient speeds and allowing the hybrid-electric vehicle 112 to be operated in electric mode with the engine 118 off under certain conditions. An electrified vehicle 112 may also be a battery electric vehicle (BEV). In a BEV configuration, the engine 118 may not be present. In other configurations, the electrified vehicle 112 may be a full hybrid-electric vehicle (FHEV) without plug-in capability.

A traction battery or battery pack 124 stores energy that can be used by the electric machines 114. The vehicle battery pack 124 may provide a high voltage direct current (DC) output. The traction battery 124 may be electrically coupled to one or more power electronics modules 126. One or more contactors 142 may isolate the traction battery 124 from other components when opened and connect the traction battery 124 to other components when closed. The power electronics module 126 is also electrically coupled to the electric machines 114 and provides the ability to bi-directionally transfer energy between the traction battery 124 and the electric machines 114. For example, a traction battery 124 may provide a DC voltage while the electric machines 114 may operate with a three-phase alternating current (AC) to function. The power electronics module 126 may convert the DC voltage to a three-phase AC current to operate the electric machines 114. In a regenerative mode, the power electronics module 126 may convert the three-phase AC current from the electric machines 114 acting as generators to the DC voltage compatible with the traction battery 124.

The vehicle 112 may include a variable-voltage converter (VVC) 152 electrically coupled between the traction battery 124 and the power electronics module 126. The VVC 152 may be a DC/DC boost converter configured to increase or boost the voltage provided by the traction battery 124. By increasing the voltage, current requirements may be decreased leading to a reduction in wiring size for the power electronics module 126 and the electric machines 114. Further, the electric machines 114 may be operated with better efficiency and lower losses.

In addition to providing energy for propulsion, the traction battery 124 may provide energy for other vehicle electrical systems. The vehicle 112 may include a DC/DC converter module 128 that converts the high voltage DC output of the traction battery 124 to a low voltage DC supply that is compatible with low-voltage vehicle loads. An output of the DC/DC converter module 128 may be electrically coupled to an auxiliary battery 130 (e.g., 12V battery) for charging the auxiliary battery 130. The low-voltage systems may be electrically coupled to the auxiliary battery 130. One or more electrical loads 146 may be coupled to the high-voltage bus. The electrical loads 146 may have an associated controller that operates and controls the electrical loads 146 when appropriate. Examples of electrical loads 146 may be a fan, an electric heating element and/or an air-conditioning compressor.

The electrified vehicle 112 may be configured to recharge the traction battery 124 from an external power source 136. The external power source 136 may be a connection to an electrical outlet. The external power source 136 may be electrically coupled to a charger or electric vehicle supply equipment (EVSE) 138. The external power source 136 may be an electrical power distribution network or grid as provided by an electric utility company. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for plugging into a charge port 134 of the vehicle 112. The charge port 134 may be any type of port configured to transfer power from the EVSE 138 to the vehicle 112. The charge port 134 may be electrically coupled to a charger or on-board power conversion module 132. The power conversion module 132 may condition the power supplied from the EVSE 138 to provide the proper voltage and current levels to the traction battery 124. The power conversion module 132 may interface with the EVSE 138 to coordinate the delivery of power to the vehicle 112. The EVSE connector 140 may have pins that mate with corresponding recesses of the charge port 134. Alternatively, various components described as being electrically coupled or connected may transfer power using a wireless inductive coupling.

One or more wheel brakes 144 may be provided for decelerating the vehicle 112 and preventing motion of the vehicle 112. The wheel brakes 144 may be hydraulically actuated, electrically actuated, or some combination thereof. The wheel brakes 144 may be a part of a brake system 150. The brake system 150 may include other components to operate the wheel brakes 144. For simplicity, the figure depicts a single connection between the brake system 150 and one of the wheel brakes 144. A connection between the brake system 150 and the other wheel brakes 144 is implied. The brake system 150 may include a controller to monitor and coordinate the brake system 150. The brake system 150 may monitor the brake components and control the wheel brakes 144 for vehicle deceleration. The brake system 150 may respond to driver commands and may also operate autonomously to implement features such as stability control. The controller of the brake system 150 may implement a method of applying a requested brake force when requested by another controller or sub-function.

Electronic modules in the vehicle 112 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 130. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 1 but it may be implied that the vehicle network may connect to any electronic module that is present in the vehicle 112. A vehicle system controller (VSC) 148 may be present to coordinate the operation of the various components.

Figure 2:
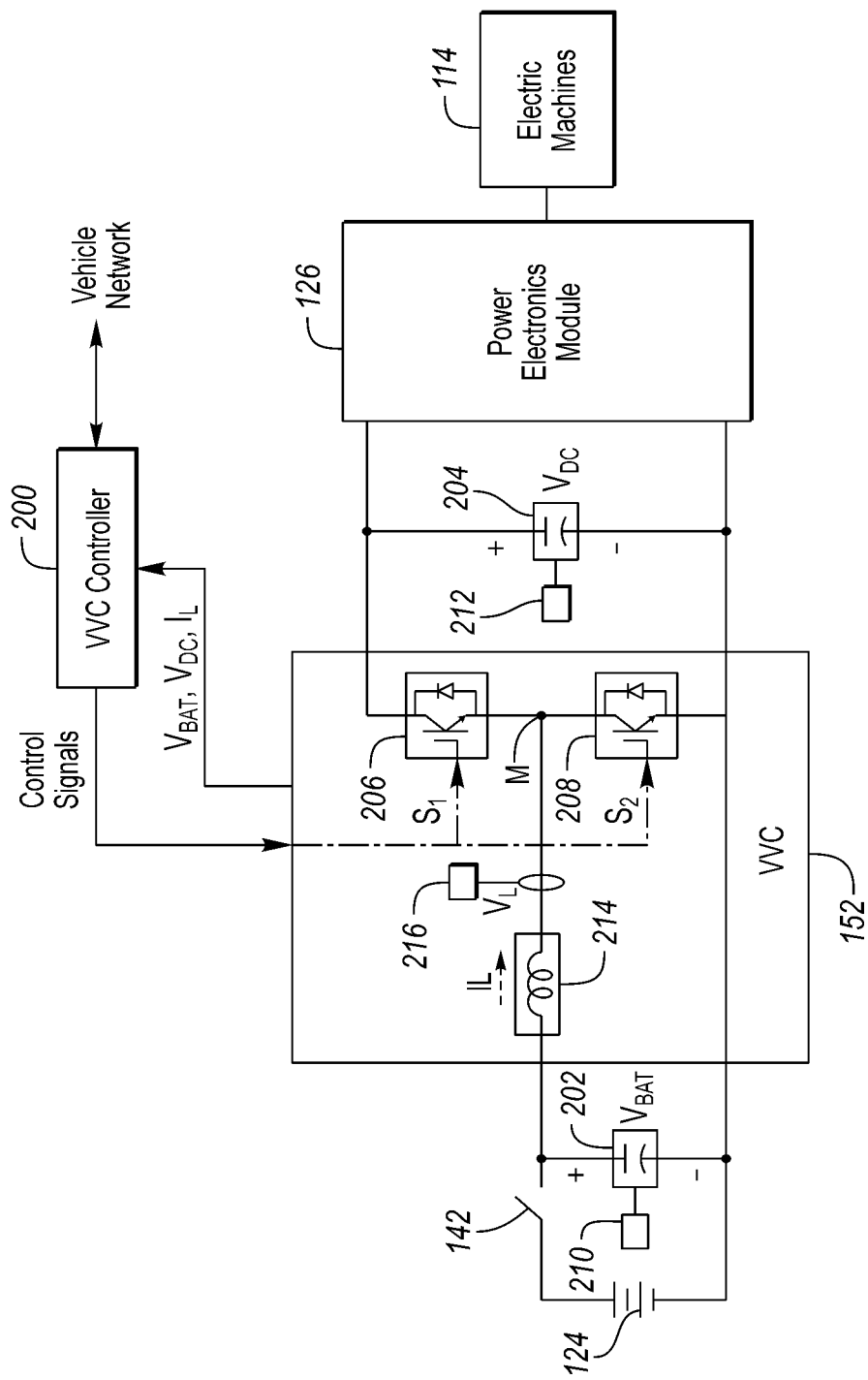
FIG. 2 is a schematic diagram of a vehicular variable voltage converter.

FIG. 2 depicts a diagram of a VVC 152 that is configured as a boost converter. The VVC 152 may include input terminals that may be coupled to terminals of the traction battery 124 through the contactors 142. The VVC 152 may include output terminals coupled to terminals of the power electronics module 126. The VVC 152 may be operated to cause a voltage at the output terminals to be greater than a voltage at the input terminals. The vehicle 112 may include a VVC controller 200 that monitors and controls electrical parameters (e.g., voltage and current) at various locations within the VVC 152. In some configurations, the VVC controller 200 may be included as part of the VVC 152. The VVC controller 200 may determine an output voltage reference, $V_{dc}^*$. The VVC controller 200 may determine, based on the electrical parameters and the voltage reference, $V_{dc}^*$, a control signal sufficient to cause the VVC 152 to achieve the desired output voltage. In some configurations, the control signal may be implemented as a pulse-width modulated (PWM) signal in which a duty cycle of the PWM signal is varied. The control signal may be operated at a predetermined switching frequency. The VVC controller 200 may command the VVC 152 to provide the desired output voltage using the control signal. The particular control signal at which the VVC 152 is operated may be directly related to the amount of voltage boost to be provided by the VVC 152.

The output voltage of the VVC 152 may be controlled to achieve a desired reference voltage. In some configurations, the VVC 152 may be a boost converter. In a boost converter configuration in which the VVC controller 200 controls the duty cycle, the ideal relationship between the input voltage $V_{in}$ and the output voltage $V_{out}$ and the duty cycle D may be illustrated using the following equation:

$$V_{out} = \frac{V_{in}}{(1-D)} \quad 1)$$

The desired duty cycle, D, may be determined by measuring the input voltage (e.g., traction battery voltage) and setting the output voltage to the reference voltage. The VVC 152 may be a buck converter that reduces the voltage from input to output. In a buck configuration, a different expression relating the input and output voltage to the duty cycle may be derived. In some configurations, the VVC 152 may be a buck-boost converter that may increase or decrease the input voltage. The control strategy described herein is not limited to a particular variable voltage converter topology.

With reference to FIG. 2, the VVC 152 may boost or "step up" the voltage potential of the electrical power provided by the traction battery 124. The traction battery 124 may provide high voltage (HV) DC power. In some configurations, the traction battery 124 may provide a voltage between 150 and 400 Volts. The contactor 142 may be electrically coupled in series between the traction battery 124 and the VVC 152. When the contactor 142 is closed, the HV DC power may be transferred from the traction battery 124 to the VVC 152. An input capacitor 202 may be electrically coupled in parallel to the traction battery 124. The input capacitor 202 may stabilize the bus voltage and reduce any voltage and current ripple. The VVC 152 may receive the HV DC power and boost or "step up" the voltage potential of the input voltage according to the duty cycle.

An output capacitor 204 may be electrically coupled between the output terminals of the VVC 152. The output capacitor 204 may stabilize the bus voltage and reduce voltage and current ripple at the output of the VVC 152.

Further with reference to FIG. 2, the VVC 152 may include a first switching device 206 and a second switching device 208 for boosting an input voltage to provide the boosted output voltage. The switching devices 206, 208 may be configured to selectively flow a current to an electrical load (e.g., power electronics module 126 and electric machines 114). Each switching device 206, 208 may be individually controlled by a gate drive circuit (not shown) of the VVC controller 200 and may include any type of controllable switch (e.g., an insulated gate bipolar transistor (IGBT) or field-effect transistor (FET)). The gate drive circuit may provide electrical signals to each of the switching devices 206, 208 that are based on the control signal (e.g., duty cycle of PWM control signal). A diode may be coupled across each of the switching devices 206, 208. The switching devices 206, 208 may each have an associated switching loss. The switching losses are those power losses that occur during state changes of the switching device (e.g., on/off and off/on transitions). The switching losses may be quantified by the current flowing through and the voltage across the switching device 206, 208 during the transition. The switching devices may also have associated conduction losses that occur when the device is switched on.

The vehicle system may include sensors for measuring electrical parameters of the VVC 152. A first voltage sensor 210 may be configured to measure the input voltage, (e.g., voltage of the battery 124), and provide a corresponding input signal ($V_{bat}$) to the VVC controller 200. In one or more embodiments, the first voltage sensor 210 may measure the voltage across the input capacitor 202, which corresponds to the battery voltage. A second voltage sensor 212 may measure the output voltage of the VVC 152 and provide a corresponding input signal ($V_{dc}$) to the VVC controller 200. In one or more embodiments, the second voltage sensor 212 may measure the voltage across the output capacitor 204, which corresponds to the DC bus voltage. The first voltage sensor 210 and the second voltage sensor 212 may include circuitry to scale the voltages to a level appropriate for the VVC controller 200. The VVC controller 200 may include circuitry to filter and digitize the signals from the first voltage sensor 210 and the second voltage sensor 212.

An input inductor 214 may be electrically coupled in series between the traction battery 124 and the switching devices 206, 208. The input inductor 214 may alternate between storing and releasing energy in the VVC 152 to enable the providing of the variable voltages and currents as VVC 152 output, and the achieving of the desired voltage boost. A current sensor 216 may measure the input current through the input inductor 214 and provide a corresponding current signal ($I_L$) to the VVC controller 200. The input current through the input inductor 214 may be a result of the voltage difference between the input and the output voltage of the VVC 152, the conducting time of the switching devices 206, 208, and the inductance L of the input inductor 214. The VVC controller 200 may include circuitry to scale, filter, and digitize the signal from the current sensor 216.

The VVC controller 200 may be programmed to control the output voltage of the VVC 152. The VVC controller 200 may receive input from the VVC 152 and other controllers via the vehicle network, and determine the control signals. The VVC controller 200 may monitor the input signals ($V_{bat}$, $V_{dc}$, $I_L$, $V_{dc}^*$) to determine the control signals. For example, the VVC controller 200 may provide control signals to the gate drive circuit that correspond to a duty cycle command. The gate drive circuit may then control each switching device 206, 208 based on the duty cycle command.

The control signals to the VVC 152 may be configured to drive the switching devices 206, 208 at a particular switching frequency. Within each cycle of the switching frequency, the switching devices 206, 208 may be operated at the specified duty cycle. The duty cycle defines the amount of time that the switching devices 206, 208 are in an on-state and an off-state. For example, a duty cycle of 100% may operate the switching devices 206, 208 in a continuous on-state with no turn off. A duty cycle of 0% may operate the switching devices 206, 208 in a continuous off-state with no turn on. A duty cycle of 50% may operate the switching devices 206, 208 in an on-state for half of the cycle and in an off-state for half of the cycle. The control signals for the two switches 206, 208 may be complementary. That is, the control signal sent to one of the switching devices (e.g., 206) may be an inverted version of the control signal sent to the other switching device (e.g., 208).

Figure 4:
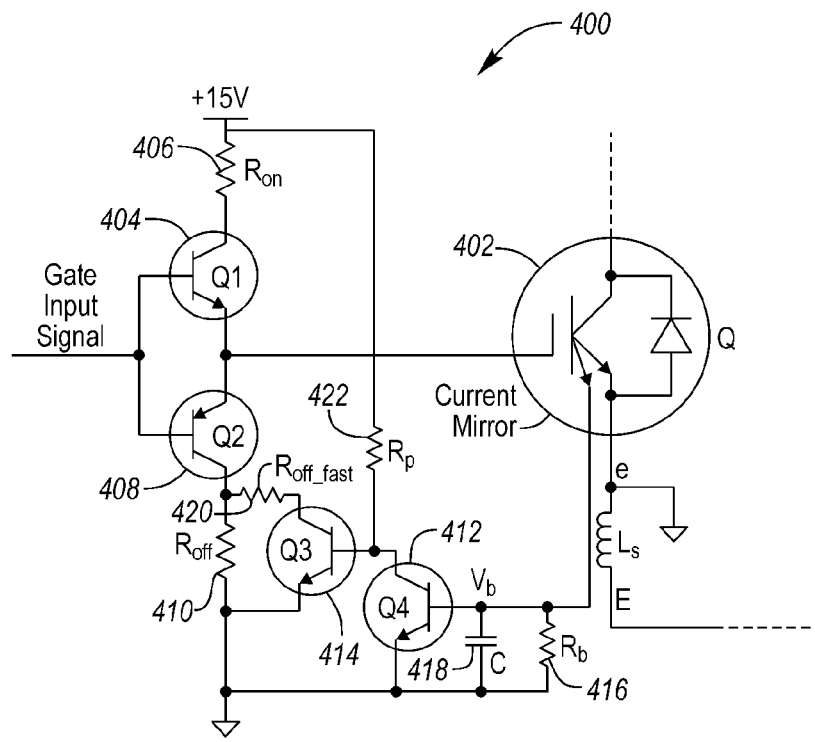
FIG. 4 is a schematic diagram of an active gate drive circuit utilizing a mirror current of an IGBT to control the IGBT during turn-off.
Figure 5:
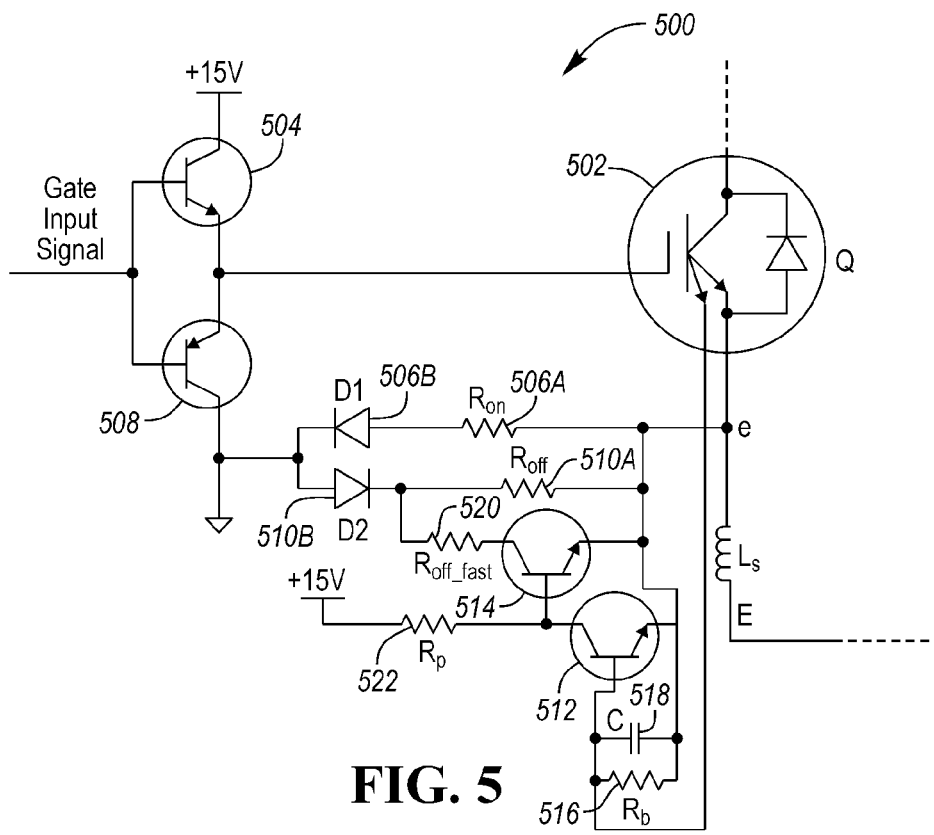
FIG. 5 is a schematic diagram of an active gate drive circuit utilizing a mirror current of an IGBT and a load voltage to control the IGBT during turn-off.

The current that is controlled by the switching devices 206, 208 may include a ripple component that has a magnitude that varies with a magnitude of the current, and the duty cycle and switching frequency of the switching devices 206, 208. Relative to the input current, the worst case ripple current magnitude occurs during relatively high input current conditions. When the duty cycle is fixed, an increase in the inductor current causes an increase in magnitude of the ripple current as illustrated in FIG. 4. The magnitude of the ripple current is also related to the duty cycle. The highest magnitude ripple current occurs when the duty cycle equals 50%. The general relationship between the inductor ripple current magnitude and the duty cycle may be as shown in FIG. 5. Based on these facts, it may be beneficial to implement measures to reduce the ripple current magnitude under high current and mid-range duty cycle conditions.

When designing the VVC 152, the switching frequency and the inductance value of the inductor 214 may be selected to satisfy a maximum allowable ripple current magnitude. The ripple component may be a periodic variation that appears on a DC signal. The ripple component may be defined by a ripple component magnitude and a ripple component frequency. The ripple component may have harmonics that are in an audible frequency range that may add to the noise signature of the vehicle. Further, the ripple component may cause difficulties with accurately controlling devices fed by the source. During switching transients, the switching devices 206, 208 may turn off at the maximum inductor current (DC current plus ripple current) which may cause large voltage spike across the switching devices 206, 208. Because of size and cost constraints, the inductance value may be selected based on the conducted current. In general, as current increases the inductance may decrease due to saturation.

The switching frequency may be selected to limit a magnitude of the ripple current component under worst case scenarios (e.g., highest input current and/or duty cycle close to 50% conditions). The switching frequency of the switching devices 206, 208 may be selected to be a frequency (e.g., 10 kHz) that is greater than a switching frequency of the motor/generator inverter (e.g., 5 kHz) that is coupled to an output of the VVC 152. In some applications, the switching frequency of the VVC 152 may be selected to be a predetermined fixed frequency. The predetermined fixed frequency is generally selected to satisfy noise and ripple current specifications. However, the choice of the predetermined fixed frequency may not provide best performance over all operating ranges of the VVC 152. The predetermined fixed frequency may provide best results at a particular set of operating conditions, but may be a compromise at other operating conditions.

Increasing the switching frequency may decrease the ripple current magnitude and lower voltage stress across the switching devices 206, 208, but may lead to higher switching losses. While the switching frequency may be selected for worst case ripple conditions, the VVC 152 may only operate under the worst case ripple conditions for a small percentage of the total operating time. This may lead to unnecessarily high switching losses that may lower fuel economy. In addition, the fixed switching frequency may concentrate the noise spectrum in a very narrow range. The increased noise density in this narrow range may result in noticeable noise, vibration, and harshness (NVH) issues.

The VVC controller 200 may be programmed to vary the switching frequency of the switching devices 206, 208 based on the duty cycle and the input current. The variation in switching frequency may improve fuel economy by reducing switching losses and reduce NVH issues while maintaining ripple current targets under worst case operating conditions.

During relatively high current conditions, the switching devices 206, 208 may experience increased voltage stress. At a maximum operating current of the VVC 152, it may be desired to select a relatively high switching frequency that reduces the ripple component magnitude with a reasonable level of switching losses. The switching frequency may be selected based on the input current magnitude such that as the input current magnitude increases, the switching frequency increases. The switching frequency may be increased up to a predetermined maximum switching frequency. The predetermined maximum switching frequency may be a level that provides a compromise between lower ripple component magnitudes and higher switching losses. The switching frequency may be changed in discrete steps or continuously over the operating current range.

The VVC controller 200 may be programmed to reduce the switching frequency in response to the current input being less than a predetermined maximum current. The predetermined maximum current may be a maximum operating current of the VVC 152. The change in the switching frequency may be based on the magnitude of the current input to the switching devices 206, 208. When the current is greater than the predetermined maximum current, the switching frequency may be set to a predetermined maximum switching frequency. As the current decreases, the magnitude of the ripple component decreases. By operating at lower switching frequencies as the current decreases, switching losses are reduced. The switching frequency may be varied based on the power input to the switching devices. As the input power is a function of the input current and the battery voltage, the input power and input current may be used in a similar manner.

Since the ripple current is also affected by the duty cycle, the switching frequency may be varied based on the duty cycle. The duty cycle may be determined based on a ratio of the input voltage to the output voltage. As such, the switching frequency may also be varied based on the ratio between the input voltage and the output voltage. When the duty cycle is near 50%, the predicted ripple current magnitude is a maximum value and the switching frequency may be set to the predetermined maximum frequency. The predetermined maximum frequency may be a maximum switching frequency value that is selected to minimize the ripple current magnitude. The switching frequency may be changed in discrete steps or continuously over the duty cycle range.

The VVC controller 200 may be programmed to reduce the switching frequency from the predetermined maximum frequency in response to a magnitude of a difference between the duty cycle and the duty cycle value (e.g, 50%) at which the predicted ripple component magnitude is a maximum. When the magnitude of the difference is less than a threshold, the switching frequency may be set to the predetermined frequency. When the magnitude of the difference decreases, the switching frequency may be increased toward the predetermined maximum frequency to reduce the ripple component magnitude. When the magnitude of the difference is less than a threshold, the switching frequency may be set to the predetermined maximum frequency.

The switching frequency may be limited to be between the predetermined maximum frequency and a predetermined minimum frequency. The predetermined minimum frequency may be a frequency level that is greater than a predetermined switching frequency of the power electronic module 126 that is coupled to an output of the variable voltage converter 152. The switching frequency may also be based on parasitic inductance associated with the gate of the IGBT.

Figure 3:
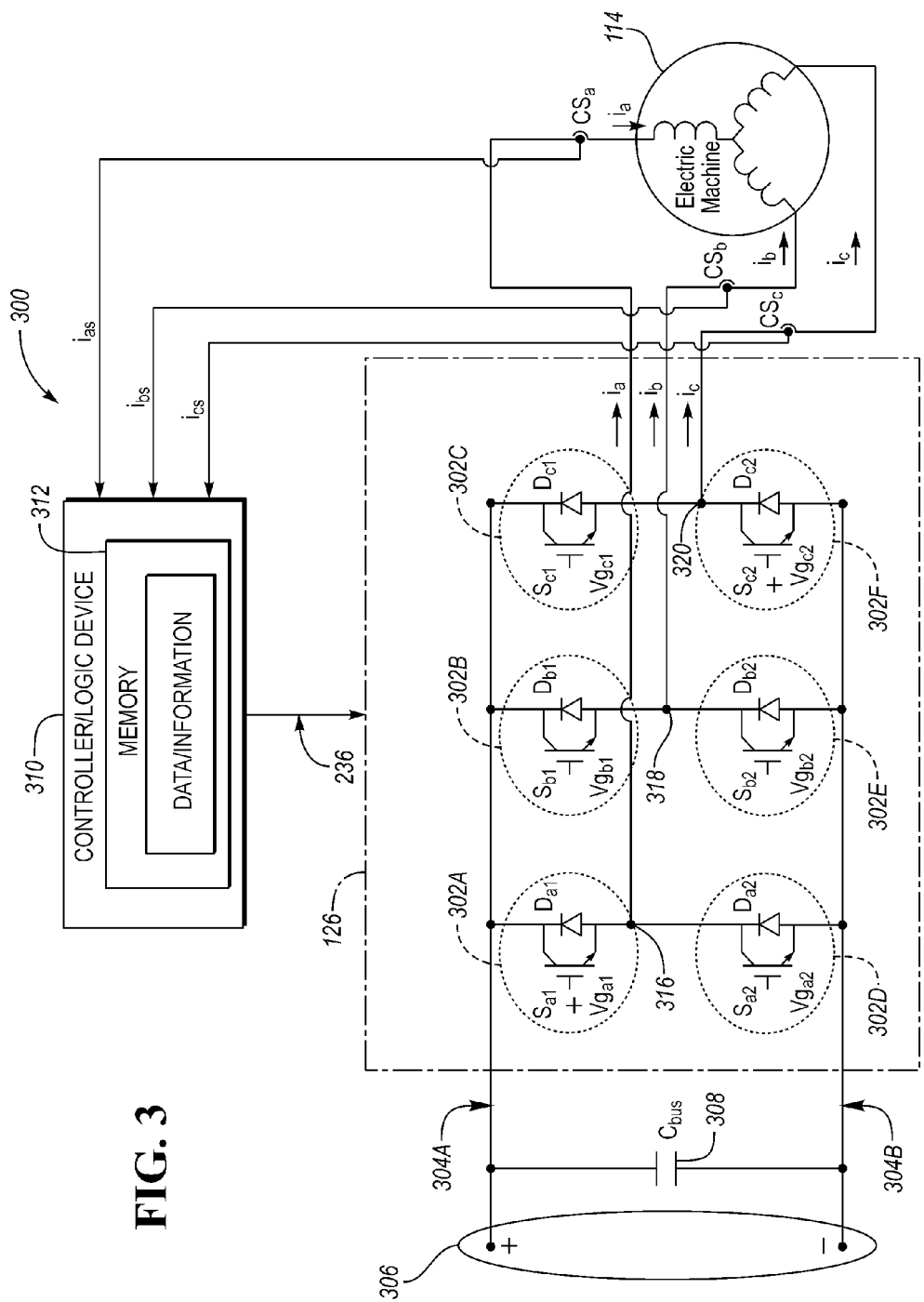
FIG. 3 is a schematic diagram of a vehicular electric machine inverter.

With reference to FIG. 3, a system 300 is provided for controlling a power electronics module (PEM) 126. The PEM 126 of FIG. 3 is shown to include a plurality of switches 302 (e.g., IGBTs) configured to collectively operate as an inverter with first, second, and third phase legs 316, 318, 320. While the inverter is shown as a three-phase converter, the inverter may include additional phase legs. For example, the inverter may be a four-phase converter, a five-phase converter, a six-phase converter, etc. In addition, the PEM 126 may include multiple converters with each inverter in the PEM 126 including three or more phase legs. For example, the system 300 may control two or more inverters in the PEM 126. The PEM 126 may further include a DC to DC converter having high power switches (e.g., IGBTs) to convert a power electronics module input voltage to a power electronics module output voltage via boost, buck or a combination thereof.

As shown in FIG. 3, the inverter may be a DC-to-AC converter. In operation, the DC-to-AC converter receives DC power from a DC power link 306 through a DC bus 304 and converts the DC power to AC power. The AC power is transmitted via the phase currents ia, ib, and ic to drive an AC machine also referred to as an electric machine 114, such as a three-phase permanent-magnet synchronous motor (PMSM) as depicted in FIG. 3. In such an example, the DC power link 306 may include a DC storage battery to provide DC power to the DC bus 304. In another example, the inverter may operate as an AC-to-DC converter that converts AC power from the AC machine 114 (e.g., generator) to DC power, which the DC bus 304 can provide to the DC power link 306. Furthermore, the system 300 may control the PEM 126 in other power electronic topologies.

With continuing reference to FIG. 3, each of the phase legs 316, 318, 320 in the inverter includes power switches 302, which may be implemented by various types of controllable switches. In one embodiment, each power switch 302 may include a diode and a transistor, (e.g., an IGBT). The diodes of FIG. 3 are labeled $D_{a1}$, $D_{a2}$, $D_{b1}$, $D_{b2}$, $D_{c1}$, and $D_{c2}$ while the IGBTs of FIG. 3 are respectively labeled $S_{a1}$, $S_{a2}$, $S_{b1}$, $S_{b2}$, $S_{c1}$, and $S_{c2}$. The power switches $S_{a1}$, $S_{a2}$, $D_{a1}$, and $D_{a2}$ are part of phase leg A of the three-phase converter, which is labeled as the first phase leg A 316 in FIG. 3. Similarly, the power switches $S_{b1}$, $S_{b2}$, $D_{b1}$, and $D_{b2}$ are part of phase leg B 318 and the power switches $S_{c1}$, $S_{c2}$, $D_{c1}$, and $D_{c2}$ are part of phase leg C 320 of the three-phase converter. The inverter may include any number of the power switches 302 or circuit elements depending on the particular configuration of the inverter. The diodes ($D_{xx}$) are connected in parallel with the IGBTs ($S_{xx}$) however, as the polarities are reversed for proper operation, this configuration is often referred to as being connected anti-parallel. A diode in this anti-parallel configuration is also called a freewheeling diode.

As illustrated in FIG. 3, current sensors $CS_a$, $CS_b$, and $CS_c$ are provided to sense current flow in the respective phase legs 316, 318, 320. FIG. 3 shows the current sensors $CS_a$, $CS_b$, and $CS_c$ separate from the PEM 126. However, current sensors $CS_a$, $CS_b$, and $CS_c$ may be integrated as part of the PEM 126 depending on its configuration. Current sensors $CS_a$, $CS_b$, and $CS_c$ of FIG. 3 are installed in series with each of phase legs A, B and C (i.e., phase legs 316, 318, 320 in FIG. 3) and provide the respective feedback signals $i_{as}$, $i_{bs}$, and $i_{cs}$ (also illustrated in FIG. 3) for the system 300. The feedback signals $i_{as}$, $i_{bs}$, and $i_{cs}$ may be raw current signals processed by logic device (LD) 310 or may be embedded or encoded with data or information about the current flow through the respective phase legs 316, 318, 320.

Also, the power switches 302 (e.g., IGBTs) may include current sensing capability. The current sensing capability may include being configured with a current mirror output, which may provide data/signals representative of $i_{as}$, $i_{bs}$, and $i_{cs}$. The data/signals may indicate a direction of current flow, a magnitude of current flow, or both the direction and magnitude of current flow through the respective phase legs A, B, and C.

Referring again to FIG. 3, the system 300 includes a logic device (LD) or controller 310. The controller or LD 310 can be implemented by various types or combinations of electronic devices and/or microprocessor-based computers or controllers. To implement a method of controlling the PEM 126, the controller 310 may execute a computer program or algorithm embedded or encoded with the method and stored in volatile and/or persistent memory 312. Alternatively, logic may be encoded in discrete logic, a microprocessor, a microcontroller, or a logic or gate array stored on one or more integrated circuit chips. As shown in the embodiment of FIG. 3, the controller 310 receives and processes the feedback signals $i_{as}$, $i_{bs}$, and $i_{cs}$ to control the phase currents $i_a$, $i_b$, and $i_c$ such that the phase currents $i_a$, $i_b$, and $i_c$ flow through the phase legs 316, 318, 320 and into the respective windings of the electric machine 114 according to various current or voltage patterns. For example, current patterns can include patterns of phase currents $i_a$, $i_b$, and $i_c$ flowing into and away from the DC-bus 304 or a DC-bus capacitor 308. The DC-bus capacitor 308 of FIG. 3 is shown separate from the PEM 126. However, the DC-bus capacitor 308 may be integrated as part of the PEM 126.

As shown in FIG. 3, a storage medium 312 (hereinafter "memory"), such as computer-readable memory may store the computer program or algorithm embedded or encoded with the method. In addition, the memory 312 may store data or information about the various operating conditions or components in the PEM 126. For example, the memory 312 may store data or information about current flow through the respective phase legs 316, 318, 320. The memory 312 can be part of the controller 310 as shown in FIG. 3. However, the memory 312 may be positioned in any suitable location accessible by the controller 310.

As illustrated in FIG. 3, the controller 310 transmits at least one control signal 236 to the power converter system 126. The power converter system 126 receives the control signal 322 to control the switching configuration of the inverter and therefore the current flow through the respective phase legs 316, 318, and 320. The switching configuration is a set of switching states of the power switches 302 in the inverter. In general, the switching configuration of the inverter determines how the inverter converts power between the DC power link 306 and the electric machine 114.

To control the switching configuration of the inverter, the inverter changes the switching state of each power switch 302 in the inverter to either an ON state or an OFF state based on the control signal 322. In the illustrated embodiment, to switch the power switch 302 to either ON or OFF states, the controller/LD 310 provides the gate voltage (Vg) to each power switch 302 and therefore drives the switching state of each power switch 302. Gate voltages $Vg_{a1}$, $Vg_{a2}$, $Vg_{b1}$, $Vg_{b2}$, $Vg_{c1}$, and $Vg_{c2}$ (shown in FIG. 3) control the switching state and characteristics of the respective power switches 302. While the inverter is shown as a voltage-driven device in FIG. 3, the inverter may be a current-driven device or controlled by other strategies that switch the power switch 302 between ON and OFF states. The controller 310 may change the gate drive for each IGBT based on the rotational speed of the electric machine 114, the mirror current, or a temperature of the IGBT switch. The change in gate drive may be selected from a plurality of gate drive currents in which the change gate drive current is proportional to a change in IGBT switching speed.

As also shown in FIG. 3, each phase leg 316, 318, and 320 includes two switches 302. However, only one switch in each of the legs 316, 318, 320 can be in the ON state without shorting the DC power link 306. Thus, in each phase leg, the switching state of the lower switch is typically opposite the switching state of the corresponding upper switch. Consequently, a HIGH state of a phase leg refers to the upper switch in the leg in the ON state with the lower switch in the OFF state. Likewise, a LOW state of the phase leg refers to the upper switch in the leg in the OFF state with the lower switch in the ON state. As a result, IGBTs with current mirror capability may be on all IGBTs, a subset of IGBTs (e.g., $S_{a1}$, $S_{b1}$, $S_{c1}$) or a single IGBT.

Two situations can occur during an active state of the three-phase converter example illustrated in FIG. 2: (1) two phase legs are in the HIGH state while the third phase leg is in the LOW state, or (2) one phase leg is in the HIGH state while the other two phase legs are in the LOW state. Thus, one phase leg in the three-phase converter, which may be defined as the "reference" phase for a specific active state of the inverter, is in a state opposite to the other two phase legs, or "non-reference" phases, that have the same state. Consequently, the non-reference phases are either both in the HIGH state or both in the LOW state during an active state of the inverter.

FIG. 4 is a schematic diagram of an active gate drive circuit 400 utilizing a mirror current of an IGBT 402 to control the IGBT 402 during turn-off. Here, a gate of the IGBT 402 is driven by a pull-up or high side switch 404 having a series on resistance Ron 406 to control the turn-on speed and characteristics of the IGBT 402. IGBTs used in high power applications, may include a mirror current sense pin, a kelvin emitter, and a power emitter. The power emitter may use a bus bar connected between the chip, specifically the emitter pad of the chip and module package terminal. Due to the bonding of the bus bar to the chip, the bus bar has a parasitic inductance. Depending upon the configuration, the parasitic inductance may be large and have an impact on the operation of the circuit. The inductance from the emitter bus bar in particular may be part of both power and gate drive loops. To reduce the coupling between a power loop and a gate drive loop also referred to as a control loop, caused by the common inductance, a Kelvin emitter (labeled "e" in FIG. 4) may be included that is connected directly to the chip emitter and is used for the gate drive return path.

The on resistance Ron 406 is in the low voltage supply path. The low voltage supply path starts at the low voltage supply, shown here as +15V travels through Ron 406 and switch Q1 404 to the gate of IGBT 402 through the kelvin emitter, shown here as node "e", and to the chassis ground. Also, the gate of the IGBT is driven by a pull-down or low side switch 408 having a series on resistance Roff 410 to control the turn-off speed and characteristics of the IGBT 402. It is often desirable to control the rate at which the IGBT is shut off. The use of a gate drive circuit 400 including an IGBT with a power emitter, a kelvin emitter, and a current mirror sense pin that is used to generate a point voltage based on resistor Rb 416 and is filtered by capacitor C 418 allows for the control and separation of the power loop and the control loop. The control loop is a low power loop, typically having a voltage less than 25 Volts, and the power loop may include a high voltage battery, DC bus, an inductor for a vehicular DC-DC converter, or an electric machine of a vehicle. When the IGBT 402 is driving a large current, the voltage across the resistor Rb 416 increases and turns on transistor Q4 412. When transistor Q4 412 is turned on, a current flows through resistor Rp 422 lowering the voltage on the base of transistor Q3 414 shutting it off. If the current flowing through the mirror sense pin is low, the current flowing though the power emitter and the kelvin emitter will also be low, thus turning on the transistor Q3 414 such that resistor Roff_fast 420 will be coupled in parallel with resistor Roff 410. The parallel configuration of resistor Roff_fast 420 and resistor Roff 410 produces a lower effective gate resistance thus increasing the current flowing from the gate of the IGBT 402.

The gate drive circuit 400 can actively adjust the turn-off switching speed based on different current levels. The resistance Roff 410 is coupled in parallel with a NPN BJT Q3 414 that is in series with a fast-turn-off resistor Roff_fast 420. Typically the resistance of the fast-turn-off resistor Roff_fast 420 is smaller than Roff 410. The base of the NPN BJT Q3 414 is coupled with a collector of a second NPN BJT Q4 412 and is also connected with the gate driver power supply through resistor Rp 422. The base of the second NPN BJT Q4 412 is coupled with the mirror current sense pin of the IGBT 402. An IGBT current mirror sensing pin is integrated in the IGBT module and is common in state-of-the-art IGBT devices. Typically, a current flowing through the current mirror sense is a fraction of the current flowing though the collector of the IGBT 402. Between the base terminal of second NPN BJT Q4 412 and the mirror current sense pin of the IGBT 402, there is resistor Rb 416, and capacitor C 418. The use of capacitor C 418 filters the voltage resistor Rb 416.

When there is current flowing through the IGBT, the current mirror pin will have a voltage drop across the resistor Rb. Vb will determine the operation point of Q4. The capacitor C is used to filter the noise during switching transients. Rb is selected such that when the IGBT current is above certain current level (lower than short circuit protection current), Q4 will be turned on. If the IGBT current is low, Q4 will be turned off. When Q4 is off, Q3 is turned on by the 15V and Rp. Therefore, at low current conditions, the IGBT can be turned off with the lower resistance Roff_fast. When Q4 is on due to high IGBT current, Q3 is turned off. Therefore, the IGBT will be turned off through the larger resistance Roff.

The gate drive circuit 400 can actively adjust the IGBT turn-off switching speed at different current levels. Compared with a conventional gate driver circuit, the gate drive circuit 400 has additional components including two low-voltage NPN BJTs (Q3 414 and Q4 412), three resistors (Rb 416, Rp 422, and Roff_fast 420) and a capacitor C 418, however the circuit is easily implemented and low cost. The gate drive circuit 400 is typically designed to maintain the maximum surge voltage similar to the conventional design via the resistor Roff 410. However, this gate drive circuit 400 may also be configured to reduce the turn-off switching losses in low current operation regions via the resistor Roff_fast 420. The low current region is an operating region in which many powertrain systems operate a majority of their time, thus improving the system efficiency significantly.

FIG. 5 is a schematic diagram of an active gate drive circuit 500 utilizing a mirror current of an IGBT 502 and a load voltage to control the IGBT 502 during turn-off. Here, a gate of the IGBT 502 is driven by a pull-up or high side switch 504. The pull-up is in a control loop which includes the +15V supply flowing low power through the switch 504 to a gate of the IGBT 502 to the Kelvin emitter, shown as point "e", then through an on resistance Ron 506A that flows through an on diode D1 506B to chassis ground. The resistor Ron 506A and diode D1 506B are in the return path of the control loop and are used to control the turn-on speed and characteristics of the IGBT 502. Also, the gate of the IGBT is driven by a pull-down or low side switch 508 having an off resistance Roff 510A that flows through an off diode D2 510B to control the turn-off speed and characteristics of the IGBT 502. It is often desirable to control the rate at which the IGBT is shut off. Here, the gate drive circuit 500 includes an IGBT 502 with a current mirror sensing pin to generate a voltage across a resistor Rb 516 that is used to set a turn-on voltage of transistor 512 that is filtered by capacitor C 518. When the IGBT 502 is driving a large current, the voltage across the resistor Rb 516 increases and turns on transistor 512. When transistor 512 is turned on, a current flows through resistor Rp 522 lowering the voltage on the base of transistor 514 shutting it off. If the current flowing through the load Ls is low, the current flowing though the kelvin emitter and the current mirror sense pin will also be low, and thus turning on the transistor 514 such that resistor Roff_fast 520 will be coupled in parallel with resistor Roff 510A. The parallel configuration of resistor Roff_fast 520 and resistor Roff 510A produces a lower effective gate resistance thus increasing the current flowing from the gate of the IGBT 502.

Figure 6:
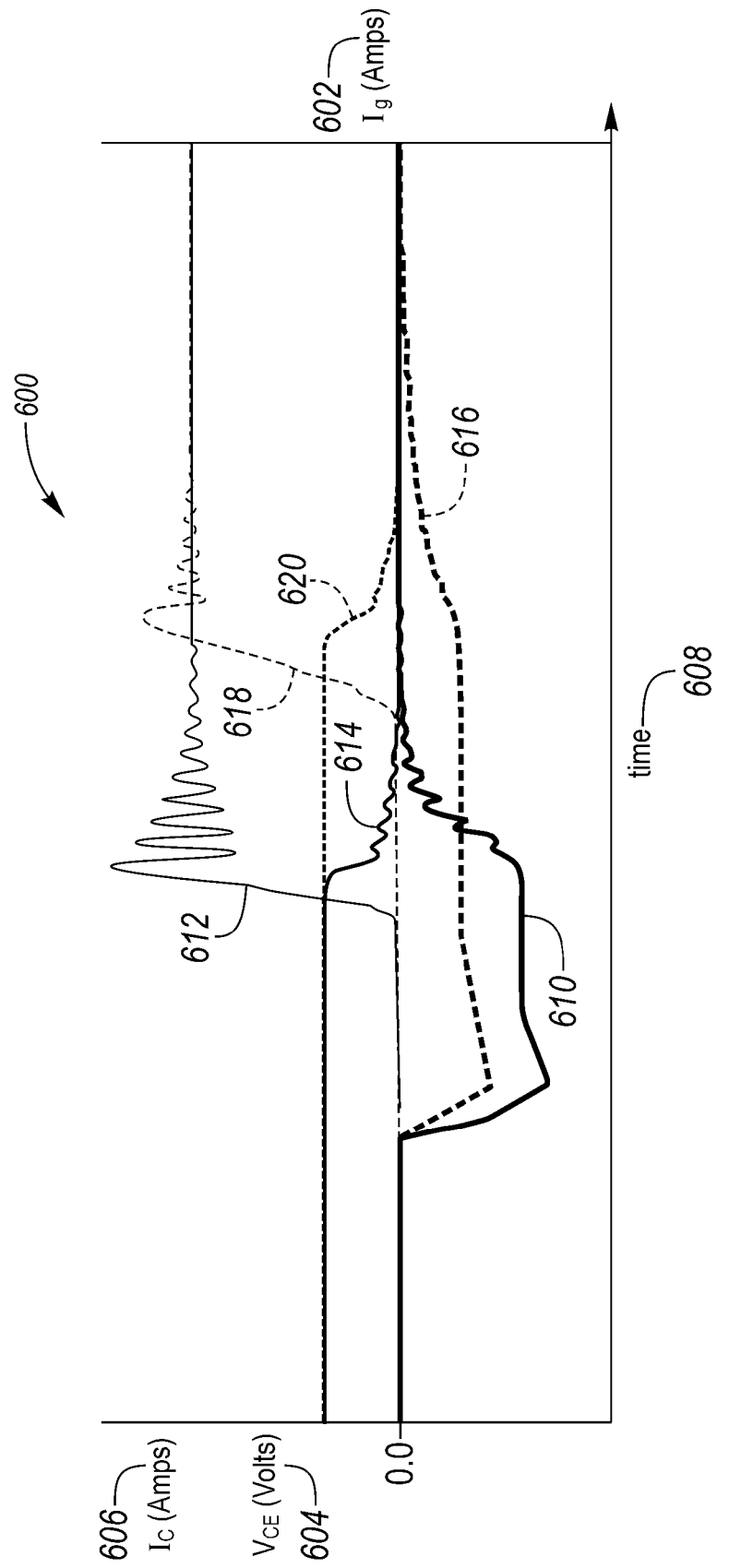
FIG. 6 is a graphical representation of IGBT operating characteristics with respect to time.

FIG. 6 is a graphical representation 600 of IGBT operating characteristics with respect to time 608. Here, a gate current (Ig) 602 flowing to and from a gate of an IGBT, a voltage across the collector to emitter (Vce) 604, and a collector current (Ic) 606 are shown with respect to time 608. The collector current 606 is based on a load current driven by the IGBT 402 of the gate drive circuit 400 of FIG. 4 being less than the threshold such that Roff_fast is enabled, the Ig 602 has a profile 610 while the Vce 604 has a profile 612 and Ic 606 has a profile 614. The threshold may be a short circuit protection threshold such that in the event of short circuit condition of a load being driven by the IGBT such that a maximum applied dc bus voltage would be applied across the IGBT, the threshold would limit the turn off. This illustrates an improved performance over operation of a conventional system not able to adjust for load current. The conventional system operations such that the Ig 602 has a profile 616 while the Vce 604 has a profile 618 and Ic 606 has a profile 620.

This simulation is a comparison of a conventional gate driver and a proposed gate driver circuit with a fast turn-off at low current. For example, consider the gate drive circuit 400 shown in FIG. 4 in which the Rb is selected such that Q3 will be completely turned off when the IGBT current is above 500 A. FIG. 6 shows the turn-off waveforms at 100A. In this case, Q3 is on for the proposed gate driver. It is seen the gate current is higher for the proposed method than the conventional method. Therefore, the IGBT can be turned off faster than the conventional method. If the current is high, (e.g., 500 A), then switch Q3 is turned off during the high current operation and the IGBT turn off waveform is substantially equal to the conventional method. Thus, this circuit allows the protection against the maximum surge voltage to be approximately the same level under both conditions.

A typical turn-off switching waveform using a conventional gate driver circuit may be considered under basically four phases. Once the turn-off process begins, a gate to emitter voltage (Vge) starts to decrease. Prior to Vge reaching a miller plateau voltage, both a collector to emitter voltage (Vce) and a collector current (Ic) remain generally constant when driving a constant load. This first phase may be referred to as a turn-off delay phase. The greater the turn-off delay, the larger the dead-time needs to designed into a vehicular inverter driving an electric machine to avoid potential shoot-through. Also, a large dead-time may degrade the inverter/converter output quality. The second phase is a Vce rising period. Vce reaches the dc link voltage at the end of this phase. At the third phase, Ic begins to decrease. Because of the leakage inductance in the power circuit, the change in collector current (Ic) that is associated with a change in emitter load current with respect to time (di/dt) will cause a surge voltage across the IGBT. The change in collector current with respect to time (di/dt) is a rate of change of collector current with respect to time (di/dt). Therefore, Vce will continue to increase and exceed the dc link voltage. Due to the Vce surge voltage, an increase in the voltage rating of the IGBT is required. In the fourth phase, Vge discharges to zero.

Figure 7A:
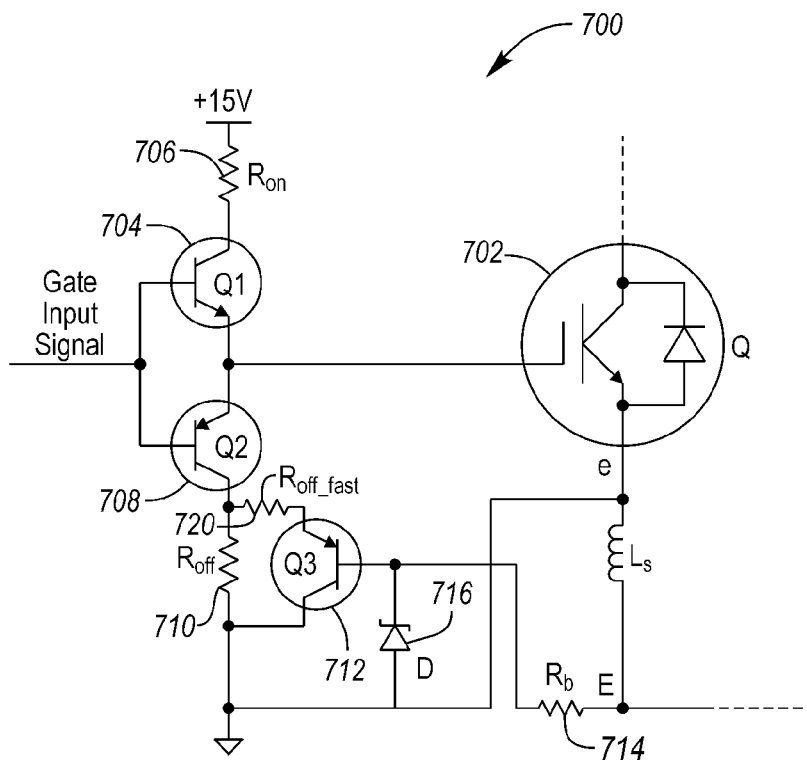
FIG. 7A is a schematic diagram of an active gate drive circuit based on a IGBT to control the IGBT during turn-off.

FIG. 7A is a schematic diagram of an active gate drive circuit 700 utilizing a Kelvin emitter of an IGBT 702 to control the IGBT 702 during turn-off. Here, a gate of the IGBT 702 is driven by a pull-up or high side switch 704 having a series-on resistance Ron 706 to control the turn-on speed and characteristics of the IGBT 702. IGBTs used in high power applications, may include a kelvin emitter, and a power emitter. The power emitter uses a bus bar connected between the chip, specifically between the emitter pad of the chip and module package terminal. Due to the bonding of the bus bar to the chip, the bus bar has a parasitic inductance shown here as Ls. Depending upon the configuration, the parasitic inductance may be large and have an impact on the operation of the circuit, specifically the operation of the low voltage circuit may be impacted by the parasitic inductance and fluctuations of the current flowing to the load. The inductance from the emitter bus bar in particular is part of both a power loop and a gate drive loop. To reduce the coupling between the power loop and the gate drive loop also referred to as a control loop, caused by the common inductance, a Kelvin emitter (labeled "e" in FIG. 7A) may be included that is connected directly to the chip emitter and is used for the gate drive return path.

The on resistance Ron 706 is in the low voltage supply path. The low voltage supply path starts at the low voltage supply, shown here as +15V travels through Ron 706 and switch Q1 704 to the gate of IGBT 702 through the kelvin emitter, shown here as node "e", and to the chassis ground. Also, the gate of the IGBT is driven by a pull-down or low-side switch 708 having a series off resistance Roff 710 to control the turn-off speed and characteristics of the IGBT 702. It is often desirable to control the rate at which the IGBT is shut off. The use of a gate drive circuit 700 including an IGBT with a power emitter, and a kelvin emitter that is used to generate a base voltage on transistor Q3 712 based on resistor Rb 714 and Zener diode D 716 that allows for the control and separation of the power loop and the control loop. The base voltage is related to a change in current flowing through the collector of the IGBT 702 with respect to time. The control loop is a low power loop, typically having a voltage less than 25 Volts, and the power loop is a high power loop, typically having a voltage over 100 volts as provided by a traction battery, DC bus, an inductor for a vehicular DC-DC converter, or an electric machine of a vehicle. When the IGBT 702 is shutting off and a large change in current flowing to the load occurs, a change in voltage across the resistor Rb 714 increases and turns on transistor Q3 712. When transistor Q3 712 is turned on, resistor Roff_fast 720 will be coupled in parallel with resistor Roff 710. The parallel configuration of resistor Roff_fast 720 and resistor Roff 710 produces a lower effective gate resistance for IGBT 702 thus increasing the current flowing from the gate of the IGBT 702.

The gate drive circuit 700 may adjust the turn-off switching speed based on a value of resistor Rb 714. The resistance Roff 710 is coupled in parallel with a PNP BJT Q3 712 that is in series with a fast-turn-off resistor Roff_fast 720. Typically the resistance of the fast-turn-off resistor Roff_fast 720 is smaller than Roff 710. The base of the PNP BJT Q3 712 is coupled with Rb 714 and the power emitter shown here as "E". When there is current flowing through the IGBT 702, the power emitter pin (E) will have a voltage drop associated with a change in voltage across the parasitic inductance "Ls" and across the resistor Rb 714. Transistor Q3 712 is turned on when Q2 708 is turned on and a change in voltage of the power emitter "E" with respect to the Kelvin emitter "e" exceeds a voltage based on a value of Rb 714. During high change in current conditions, the IGBT 702 can be turned off with the lower resistance Roff_fast 720 in parallel with Roff 710. And at low change in current conditions, the IGBT 702 can be turned on with only the higher resistance Roff 710 used to remove charge from the gate of the IGBT 702.

The gate drive circuit 700 can adjust the IGBT turn-off switching speed at different current levels. Compared with a conventional gate driver circuit, the gate drive circuit 700 has additional components including a low-voltage PNP BJT (Q3 712), resistors (Rb 714, and Roff_fast 712) and a Zener diode 716, however the circuit is easily implemented and low cost. The gate drive circuit 700 is typically designed to maintain a maximum change in surge voltage similar to the conventional design via the resistor Roff 710. However, this gate drive circuit 700 may also be configured to reduce the turn-off switching losses during low current operating regions via the resistor Roff_fast 720. This circuit can separately control the different phases of turn-off transients to achieve a short turn-off delay, fast dv/dt and low surge voltage. As this circuit does not require any amplifiers or complex devices that may additionally limit the circuit bandwidth, this circuit may be used for fast switching applications. The high change in current region is an operating region in which many powertrain systems operate a majority of their time, thus improving the system efficiency significantly.

Figure 7B:
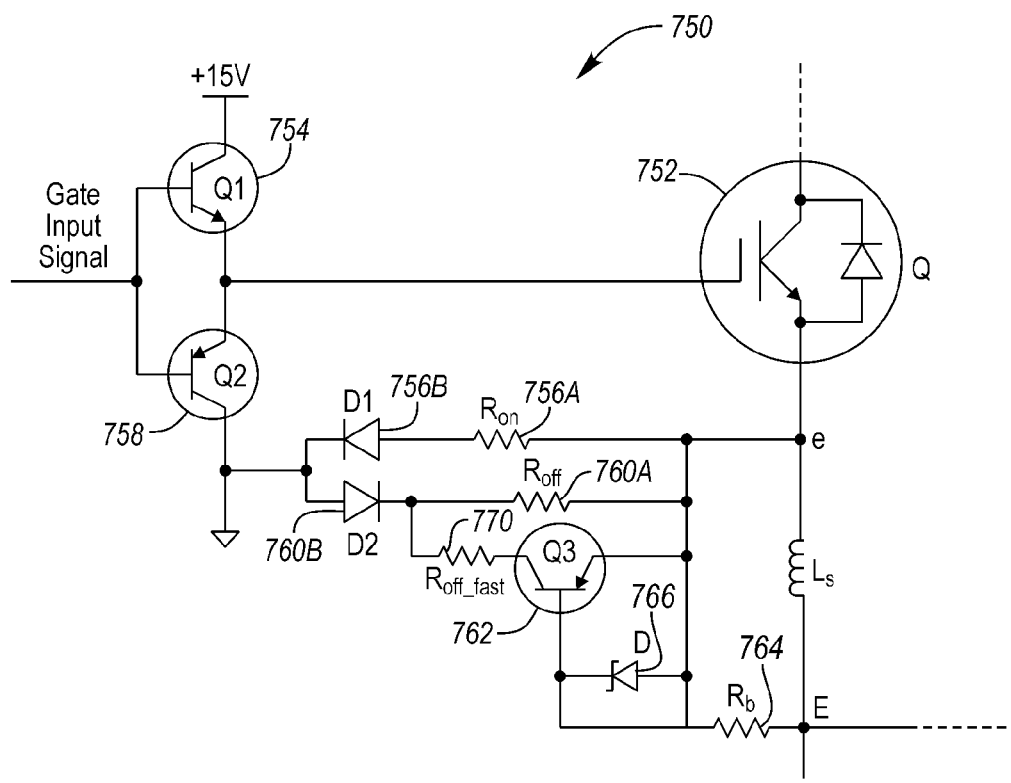
FIG. 7B is a schematic diagram of an active gate drive circuit utilizing a mirror current of an IGBT and a load voltage to control the IGBT during turn-off.

FIG. 7B is a schematic diagram of an active gate drive circuit 750 utilizing an IGBT 752 having a power emitter "E" and a Kelvin emitter "e" in which a change in load current is used to control the IGBT 752 during turn-off. Here, a gate of the IGBT 752 is driven by a pull-up or high side switch 754. The pull-up is in a control loop which includes the +15V supply flowing low power (e.g., 25 or 15 Volts) through the switch 754 to a gate of the IGBT 752 to the Kelvin emitter, shown as point "e", then through an on resistance Ron 756A that flows through an on diode D1 756B to chassis ground. The resistor Ron 756A and diode D1 756B are in the return path of the control loop and are used to control the turn-on speed and characteristics of the IGBT 752. Also, the gate of the IGBT 752 is driven by a pull-down or low side switch 758 having an off resistance Roff 760A that flows through an off diode D2 760B to control the turn-off speed and characteristics of the IGBT 752. It is often desirable to control the rate at which the IGBT is shut off. Here, the gate drive circuit 750 includes an IGBT 752 with a power emitter "E" and Kelvin emitter "e" configured to generate a voltage across a resistor Rb 764 that is used to set a turn-on voltage of transistor Q3 762. When the IGBT 752 is driving a large change in current, the voltage across the resistor Rb 764 increases and turns on transistor Q3 762. When transistor 762 is turned on, a current flows through resistor Roff_fast 770 such that it is coupled in parallel with resistor Roff 760A. The parallel configuration of resistor Roff_fast 770 and resistor Roff 760A produces a lower effective gate resistance thus increasing the current flowing from the gate of the IGBT 752.

Figure 8:
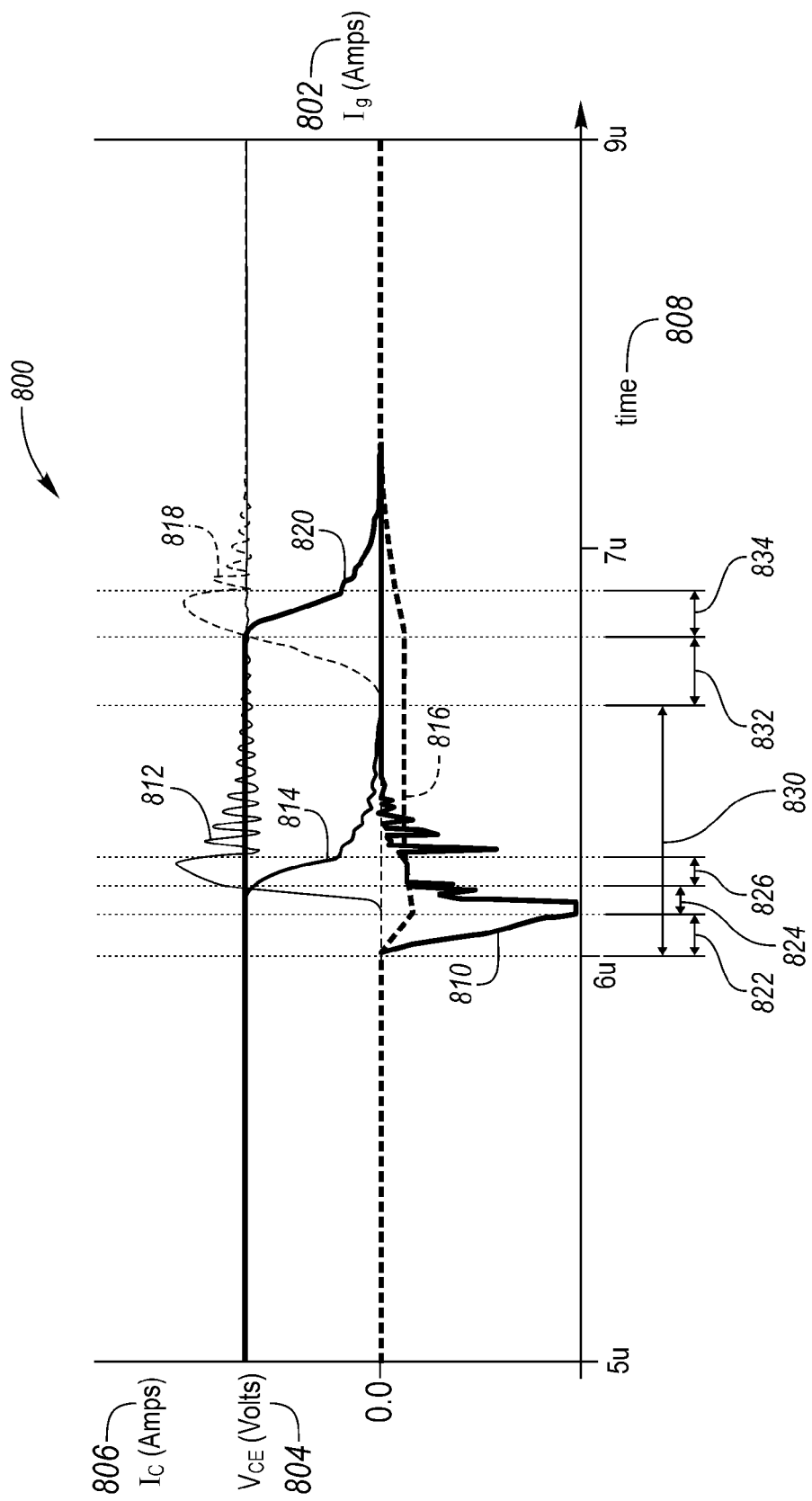
FIG. 8 is a graphical representation of IGBT operating characteristics with respect to time.

FIG. 8 is a graphical representation 800 of IGBT operating characteristics with respect to time 808. Here, a gate current (Ig) 802 flowing to and from a gate of an IGBT, a voltage across the collector to emitter (Vce) 804, and a collector current (Ic) 806 are shown with respect to time 808. The collector current 806 is based on a change in load current driven by the IGBT 702 of the gate drive circuit 700 of FIG. 7A being greater than the threshold such that Roff_fast 720 is enabled, the Ig 802 has a profile 810 while the Vce 804 has a profile 812 and Ic 806 has a profile 814. This illustrates an improved performance over operation of a conventional system not able to adjust for changes in load current. The conventional system operates such that the Ig 802 has a profile 816 while the Vce 804 has a profile 818 and Ic 806 has a profile 820. Additionally, the gate drive circuit 700 of FIG. 7A has a turn-off delay time 822 followed by a Vce rising time 824 and Ic falling time 826 less than a turn-off delay time 830, a Vce rising time 832 and Ic falling time 834 of a conventional gate drive circuit. The faster response of gate drive circuit 700 results in lower switching losses of the IGBT 702.

This simulation comparison of a conventional gate driver and a proposed gate driver circuit with a fast turn-off of a high change in load current. For example, consider the gate drive circuit 700 shown in FIG. 7A in which the Rb is selected such that Q3 will be completely turned off when a change in IGBT collector current with respect to time exceeds a threshold. FIG. 8 shows the turn-off waveforms at 100 A. In this case, transistor Q3 712 is turned on for the proposed gate driver circuit 700 based on a change in load current exceeding a threshold rate of change, the gate resistance is adjusted to increase the turned off time. This waveform 800 is also representative of operation of gate drive circuit 750.

Similar to the waveforms of FIG. 6, a typical turn-off switching waveform using a conventional gate driver circuit may be considered as mainly four phases. Once the turn-off process begins, a gate to emitter voltage (Vge) starts to decrease. Prior to Vge reaching a miller plateau voltage, both a collector to emitter voltage (Vce) and a collector current (Ic) remain generally constant when driving a constant load. This first phase may be referred to as a turn-off delay phase. The greater the turn-off delay, the larger deadtime needs to designed into a vehicular inverter driving an electric machine to avoid potential shoot-through. Also, a large dead-time may degrade the inverter/converter output quality. The second phase is a Vce rising period. Vce reaches the dc link voltage at the end of this phase. At the third phase, Ic begins to decrease. Because of the leakage inductance in the power circuit, the change in collector current (Ic) that is associated with a change in emitter load current with respect to time (di/dt) will cause a surge voltage across the IGBT. Therefore, Vce will continue to increase and exceed the dc link voltage. Due to the Vce surge voltage, an increase in the voltage rating of the IGBT is required. In the fourth phase, Vge discharges to zero.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read Only Memory (ROM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A powertrain driver circuit comprising:
   an IGBT, having a Kelvin emitter and a mirror current sense, configured to energize an inductance;
   a first switch configured to draw a current from a gate of the IGBT at a rate based on a resistance engaged by the first switch while a current of the inductance exceeds a threshold; and
   a second switch configured to increase the rate responsive to the current being less than the threshold.

2. The powertrain driver circuit of claim 1, wherein the current is based on a filtered voltage across a resistor connected between the mirror current sense and chassis ground while the Kelvin emitter is connected to chassis ground.

3. The powertrain driver circuit of claim 1, wherein the current is based on a filtered voltage across a resistor connected between the mirror current sense and the Kelvin emitter.

4. The powertrain driver circuit of claim 1, wherein the threshold is less than a short circuit protection threshold of the IGBT.

5. The powertrain driver circuit of claim 1, wherein the inductance is a phase winding of an electric machine.

6. The powertrain driver circuit of claim 1, wherein the inductance is an inductor of a DC-DC converter.

7. The powertrain driver circuit of claim 1, wherein the first and second switches are bipolar junction transistors.

8. The powertrain driver circuit of claim 1, wherein the first switch is a metal oxide semiconductor field effect transistor.

9. A method of shutting off an IGBT of an automotive power system comprising:
   by a gate driver, extracting a current from a gate of an IGBT at a rate based on a resistance associated with closing a second switch in response to a phase current of an electric machine driven by the IGBT being less than a threshold; and
   in response to the phase current exceeding the threshold, opening the second switch to decrease the rate.

10. The method of claim 9, wherein the phase current exceeding the threshold is based on a filtered voltage across a resistor coupled between a mirror current sense of the IGBT and ground.

11. The method of claim 9, wherein the phase current exceeding the threshold is based on a filtered voltage across a resistor connected between a mirror current sense of the IGBT and a Kelvin emitter of the IGBT.

12. A powertrain driver circuit comprising:
    an IGBT, having a Kelvin emitter, configured to energize an inductance;
    a first switch configured to draw a current from a gate of the IGBT at a rate based on a resistance engaged by the first switch; and
    a second switch configured to increase the rate responsive to a rate of change of current of the inductance exceeding a threshold rate of change.

13. The powertrain driver circuit of claim 12, wherein the rate of change of current is based on a voltage across a resistor connected between a power emitter of the IGBT and a control lead of the second switch, while the Kelvin emitter is connected to chassis ground.

14. The powertrain driver circuit of claim 13, wherein the second switch is a bipolar junction transistor (BJT) and the control lead is a base of the BJT.

15. The powertrain driver circuit of claim 13, wherein the second switch is a metal oxide semiconductor field effect transistor (MOSFET) and the control lead is a gate of the MOSFET.

16. The powertrain driver circuit of claim 12, wherein the rate of change of current is based on a voltage across a resistor connected between the Kelvin emitter and a power emitter of the IGBT.

17. The powertrain driver circuit of claim 12, wherein the threshold rate of change is less than a short circuit protection threshold of the IGBT.

18. The powertrain driver circuit of claim 12, wherein the inductance is a phase winding of an electric machine.

19. The powertrain driver circuit of claim 12, wherein the inductance is an inductor of a DC-DC converter.

20. The powertrain driver circuit of claim 12, wherein the first and second switches are bipolar junction transistors.

\* \* \* \* \*